US011387241B2

(12) United States Patent
Chen

(10) Patent No.: US 11,387,241 B2
(45) Date of Patent: Jul. 12, 2022

(54) METHOD FOR FABRICATING FLASH MEMORY

(71) Applicant: UNITED MICROELECTRONICS CORPORATION, Hsinchu (TW)

(72) Inventor: Ming-Shing Chen, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 158 days.

(21) Appl. No.: 17/027,730

(22) Filed: Sep. 22, 2020

(65) Prior Publication Data

US 2022/0093620 A1    Mar. 24, 2022

(51) Int. Cl.
*H01L 27/11521* (2017.01)
*H01L 27/11558* (2017.01)
*H01L 29/66* (2006.01)

(52) U.S. Cl.
CPC .. *H01L 27/11521* (2013.01); *H01L 27/11558* (2013.01); *H01L 29/6653* (2013.01)

(58) Field of Classification Search
CPC ..... H01L 21/823468; H01L 21/823864; H01L 29/66689; H01L 29/66719; H01L 27/11517–1156; H01L 29/42324–42336; H01L 29/788–7889; H01L 29/6653; G11C 16/0408–0458; G11C 11/5621–5642
See application file for complete search history.

(56) References Cited

U.S. PATENT DOCUMENTS

| | | | |
|---|---|---|---|
| 5,242,848 | A | 9/1993 | Yeh |
| 6,069,040 | A | 5/2000 | Miles et al. |
| 6,090,668 | A | 7/2000 | Lin et al. |
| 6,194,300 | B1 | 2/2001 | Hung et al. |
| 6,221,716 | B1 | 4/2001 | Lee et al. |
| 6,355,527 | B1 | 3/2002 | Lin et al. |
| 6,710,396 | B1 | 3/2004 | Wu |
| 7,868,375 | B2 | 1/2011 | Liu et al. |
| 8,471,328 | B2 | 6/2013 | Chen et al. |
| 9,159,844 | B2 | 10/2015 | Lee et al. |
| 9,324,724 | B1 | 4/2016 | Liu et al. |
| 9,455,322 | B1 | 9/2016 | Chiu et al. |
| 10,468,538 | B1 | 11/2019 | Lee et al. |
| 2016/0172200 | A1 | 6/2016 | Liu et al. |

*Primary Examiner* — Amar Movva

(57) ABSTRACT

A method for fabricating flash memory is provided. A plurality of floating gate structures is formed on a gate dielectric layer in the memory device region of a substrate. The protective spacers are formed on two opposite sidewalls of each floating gate structure. A polysilicon gate structures are formed on the logic device region and a polysilicon control gate structure with an opening are formed on the memory device region to cover two adjacent floating gate structures, wherein the two protective spacers facing each other between two adjacent floating gate structures are exposed by the opening, and then the exposed protective spacer are removed. An ion implantation is performed on the substrate to form a source region between the two adjacent floating gate structures on each cell area. There will be no polysilicon material residue in the memory device region or pitting/undercutting phenomenon in the logic device region.

13 Claims, 13 Drawing Sheets

METHOD FOR FABRICATING FLASH MEMORY

FIELD OF THE INVENTION

The present invention relates to a flash memory technology, and more particularly to a method for fabricating flash memory.

BACKGROUND OF THE INVENTION

In the semiconductor technology, the sizes of semiconductor devices have been decreased for these years. Reduction of feature size, improvements of the rate, the efficiency, the density and the cost per integrated circuit unit are important goals. In general, semiconductor devices with excellent electrical performance must have internal components with good properties, such as internal components with a complete surface profile.

In the conventional process of fabricating semiconductor components such as logic cells and memory cells on a substrate, the gate heights of the logic cells and memory cells are not the same. Therefore, in the etching process, if maintaining the complete surface profile of the metal gate in the logic cell is chosen, it is easy to cause residue of the gate material in the memory cell, but if excessive etching is chosen to avoid the residue of the gate material in the memory cell, it is easy to cause pitting or undercut of the metal gate in the logic cell.

SUMMARY OF THE INVENTION

The present invention provides a method for fabricating flash memory, wherein the polysilicon control gate structure in the memory device region and the polysilicon gate structure in the logic device region may be fabricated by the same fabricating process, and there will be no polysilicon material residue in the memory device region or no pitting/undercutting phenomenon in the logic device region.

In order to achieve one or a portion of or all of the objects or other objects, an embodiment of the invention provides a method for fabricating flash memory, including: providing a substrate defining a memory device region and a logic device region, wherein the memory device region includes a plurality of cell areas; forming a gate dielectric layer on the memory device region and the logic device region of the substrate; forming a plurality of floating gate structures on the gate dielectric layer in the memory device region, wherein each of the cell areas is formed with two floating gate structures and each of the floating gate structures includes a floating gate layer and a polysilicon oxide layer on the floating gate layer; depositing an insulating layer to cover the gate dielectric layer and the floating gate structures; etching back the insulating layer and keeping a part of the insulating layer as protective spacers on two opposite sidewalls of each floating gate structure; forming a polysilicon layer to cover the gate dielectric layer, the floating gate structures and the protective spacer; forming a hard mask layer to cover the polysilicon layer; removing a part of the hard mask layer and a part of the polysilicon layer to form at least one polysilicon gate structure on the logic device region, and to form a polysilicon control gate structure on each cell area to cover two adjacent floating gate structures on each cell area, wherein the polysilicon control gate structure includes an opening to at least expose the two protective spacers facing each other between two adjacent floating gate structures; removing the exposed protective spacer; and performing an ion implantation on the substrate to form a source region between the two adjacent floating gate structures on each cell area.

In one embodiment of the invention, the steps of forming the floating gate structure include: sequentially forming a doped polysilicon layer and a silicon nitride layer on the gate dielectric layer; patterning the silicon nitride layer to form a plurality of patterned openings in the silicon nitride layer to predefine the forming regions of the floating gate structures in the doped polysilicon layer; performing a thermal oxidation process, wherein a portion of the doped polysilicon layer exposed by the patterned openings is oxidized to form the polysilicon oxide layers; selectively removing the silicon nitride layer; and etching the doped polysilicon layer by using the polysilicon oxide layer as an etching mask to form the floating gate layers.

In one embodiment of the invention, before the step of depositing the insulating layer, a thermal oxidation process is performed to form a buffer layer on the two opposite sidewalls of each floating gate structure.

In one embodiment of the invention, the material of the insulating layer is silicon nitride, and the thickness of the insulating layer is between 1500 angstroms and 3000 angstroms.

In one embodiment of the invention, the logic device region includes a first logic circuit region and a second logic circuit region for respectively setting a low-voltage component and a high-voltage component.

In one embodiment of the invention, before the step of forming the polysilicon layer, an oxidation process is at least performed on the gate dielectric layer disposed on the logic device region to make the thickness of the gate dielectric layer on the first logic circuit region and the thickness of the gate dielectric layer on the second logic circuit be different.

In one embodiment of the invention, the polysilicon layer is an undoped polysilicon layer, and the thickness of the polysilicon layer is between 1000 angstroms and 2000 angstroms.

In one embodiment of the invention, the hard mask layer is made of silicon nitride, silicon oxynitride or silicon dioxide, and the thickness of the hard mask layer is between 100 angstroms and 500 angstroms.

In one embodiment of the invention, the step of removing a part of the hard mask layer and a part of the polysilicon layer further includes: first forming a patterned photoresist layer on the hard mask layer, and then using the patterned photoresist layer as a mask to etch the hard mask layer and the polysilicon layer.

In one embodiment of the invention, the exposed protective spacer is removed with a phosphoric acid solution.

In one embodiment of the invention, after the ion implantation step is performed, the hard mask layer on the polysilicon gate structure and the polysilicon control gate structure is removed.

In one embodiment of the invention, after the step of removing the hard mask layer, an annealing process is further performed to form an activation layer on a part of a surface of the polysilicon oxide layer not covered by the polysilicon control gate structure.

In one embodiment of the invention, a thickness of the active layer is between 1 angstrom and 50 angstroms.

In the method for fabricating flash memory according to the embodiment of the present invention, the protective spacer is formed on the opposite sidewalls of each floating gate structure, so as to prevent the polysilicon residues from being gathered in the corners of opposite sides of the floating gate structure when polysilicon control gate structures in the memory device region are subsequently formed. The polysilicon control gate structure in the memory device region and the polysilicon gate structure in the logic device region may be fabricated by the same fabricating process, and there will be no polysilicon material residue in the memory device region or pitting/undercutting phenomenon in the logic device region.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
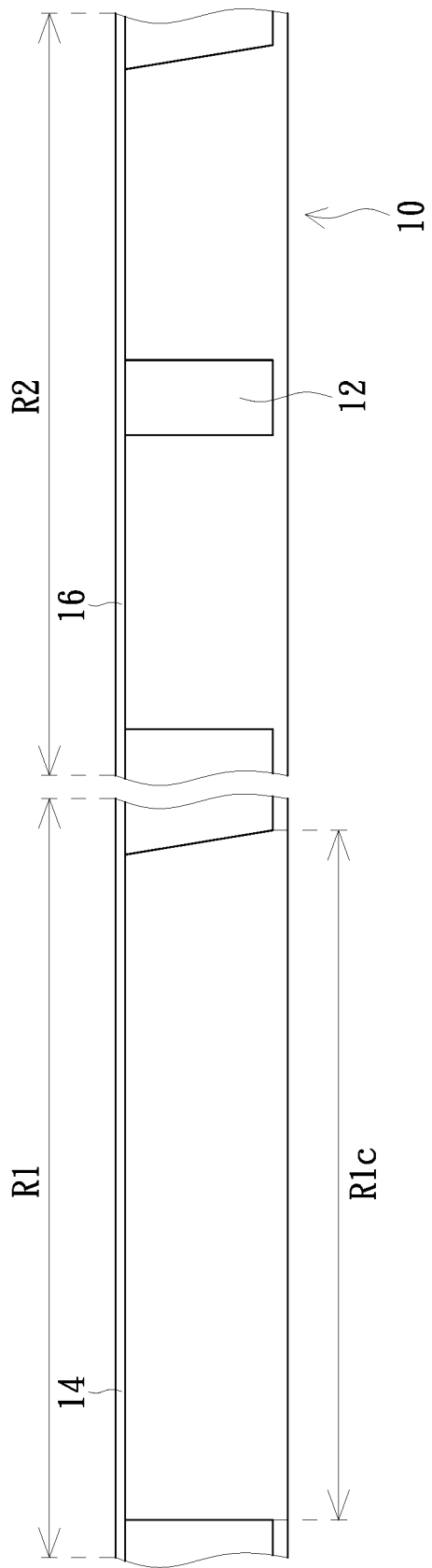
FIGS. 1A to 1M are schematic cross-sectional views for illustrating a method for fabricating flash memory according to an embodiment of the present invention.

FIGS. 1A to 1M are schematic cross-sectional views for illustrating a method for fabricating flash memory according to an embodiment of the present invention. As shown in FIG. 1A, a substrate 10 is provided. The substrate 10 is a semiconductor substrate, for example (e.g., a silicon substrate). A plurality of isolation structures 12 have been formed in the substrate 10. The isolation structures 10 are shallow trench isolation (STI) structures, for example. The substrate 10 includes a memory device region R1 and a logic device region R2, wherein the memory device region R1 includes a plurality of cell areas R1c. In the FIGURES, only single cell area R1c is shown.

A gate dielectric layer 14 is formed on the substrate 10 in the memory device region R1. Additionally, a gate dielectric layer 16 may be formed on the substrate 10 in the logic device region R2. Thicknesses of the gate dielectric layers 14, 16 may be adjusted according to the device operating voltage in each of the regions respectively. In one embodiment, the gate dielectric layers 14, 16 may be formed separately or formed at the same time. A method of forming the gate dielectric layers 14, 16 is a thermal oxidation method or a chemical vapor deposition method, for example.

Then, a plurality of floating gate structures 18 (shown in FIG. 1D) are formed on the gate dielectric layer 14 disposed on the memory device region R1. Each of the floating gate structures 14 includes a floating gate layer 20a and a polysilicon oxide layer 24 on the floating gate layer 20a.

Figure 1B:
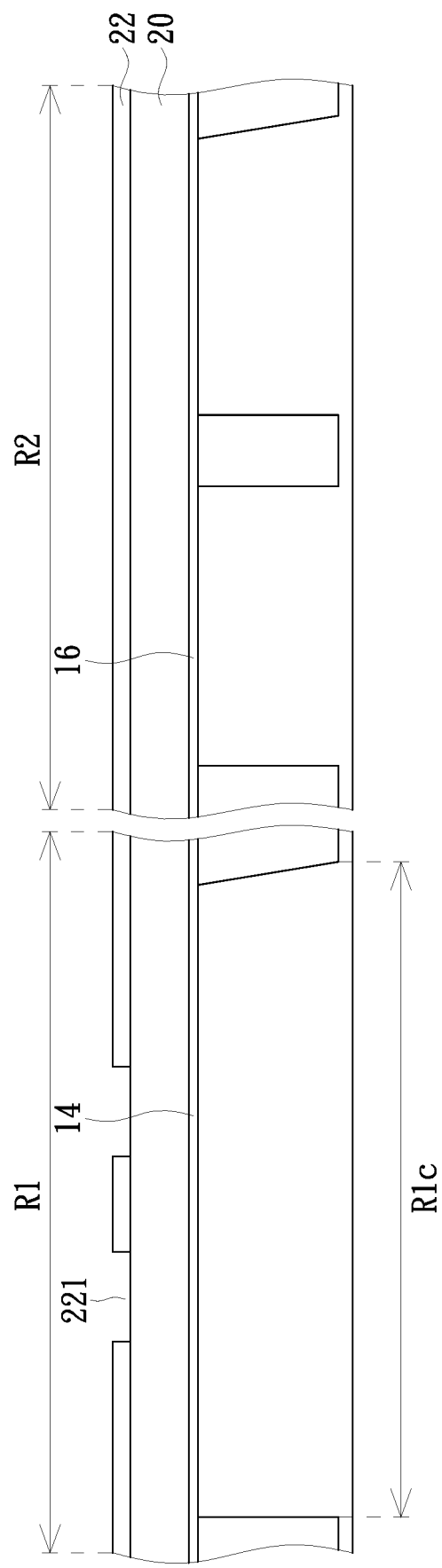
Figure 1C:
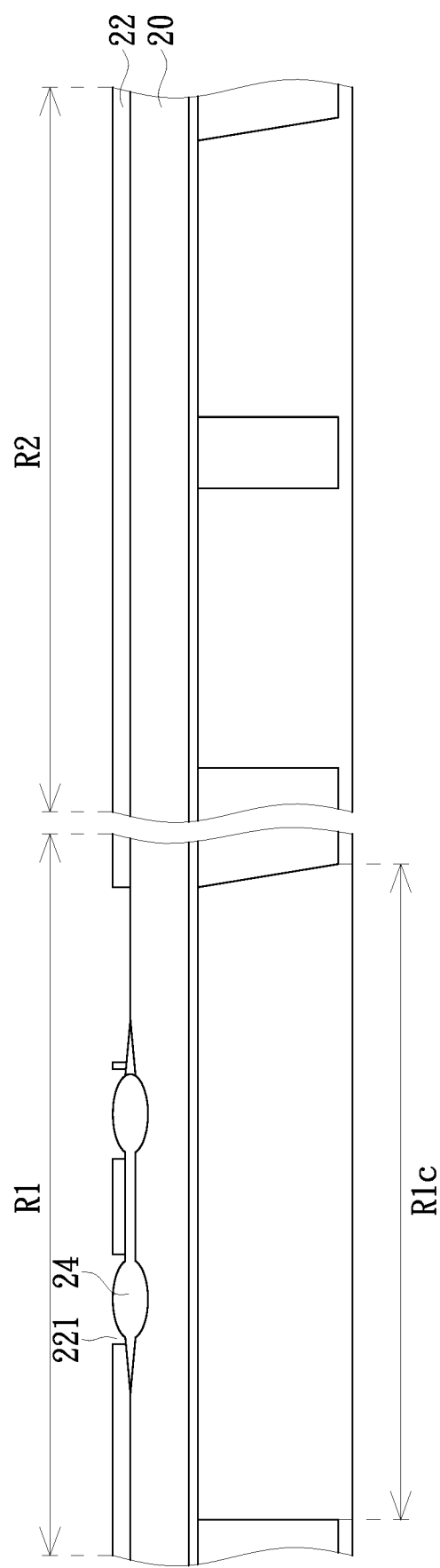
Figure 1D:
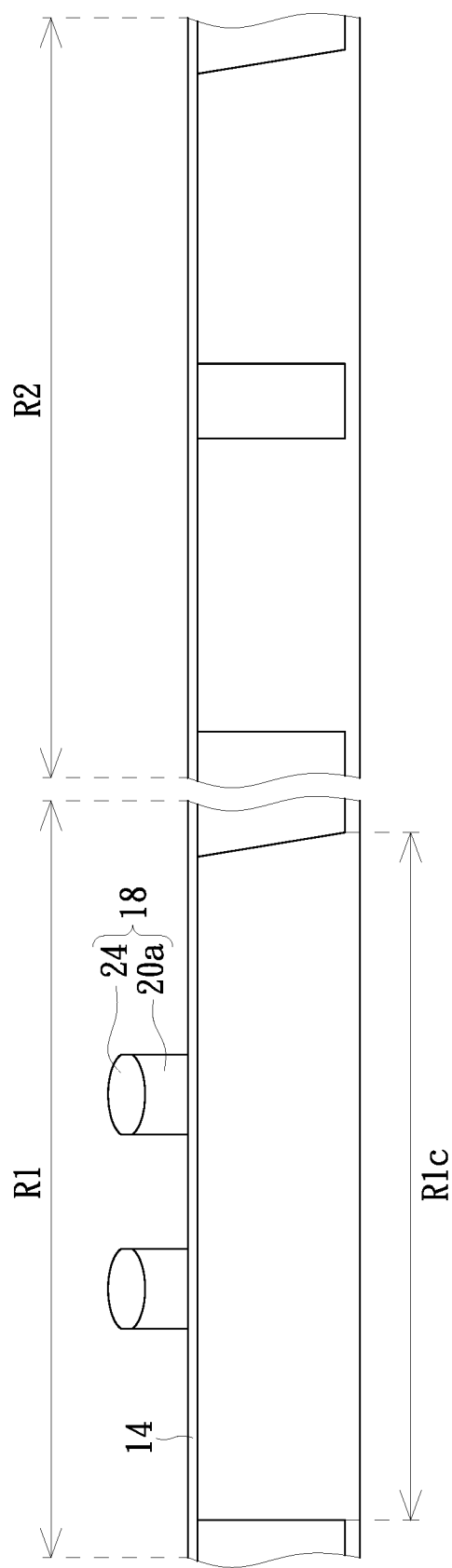

The steps of forming the floating gate structures 18 are shown in FIG. 1B to FIG. 1D. As shown in FIG. 1B, a doped polysilicon layer 20 and a silicon nitride layer 22 are formed in sequence over the gate dielectric layers 14, 16. Microlithographic and etching processes are carried out next to patterning the silicon nitride layer 22, thereby forming a plurality of patterned openings 221 in the silicon nitride layer 22 to predefine the forming regions of the floating gate structures 18 in the doped polysilicon layer 20. Then, as shown in FIG. 1C, a thermal oxidation is carried out, and hence the doped polysilicon layer 20 that is exposed by the patterned opening 221 is oxidized to form the polysilicon oxide layer 24. The silicon nitride layer 22 is then selectively removed. In one embodiment, the silicon nitride layer 22 is selectively removed by using hot phosphoric acid. Then, as shown in FIG. 1D, using the polysilicon oxide layer 24 as an etching mask, the doped polysilicon layer 20 is etched to form the floating gate layer 20a. Therefore, the floating gate structures 18 with the floating gate layer 20a and polysilicon oxide layer 24 are formed on the gate dielectric layer 14 disposed on the memory device region R1.

Figure 1E:
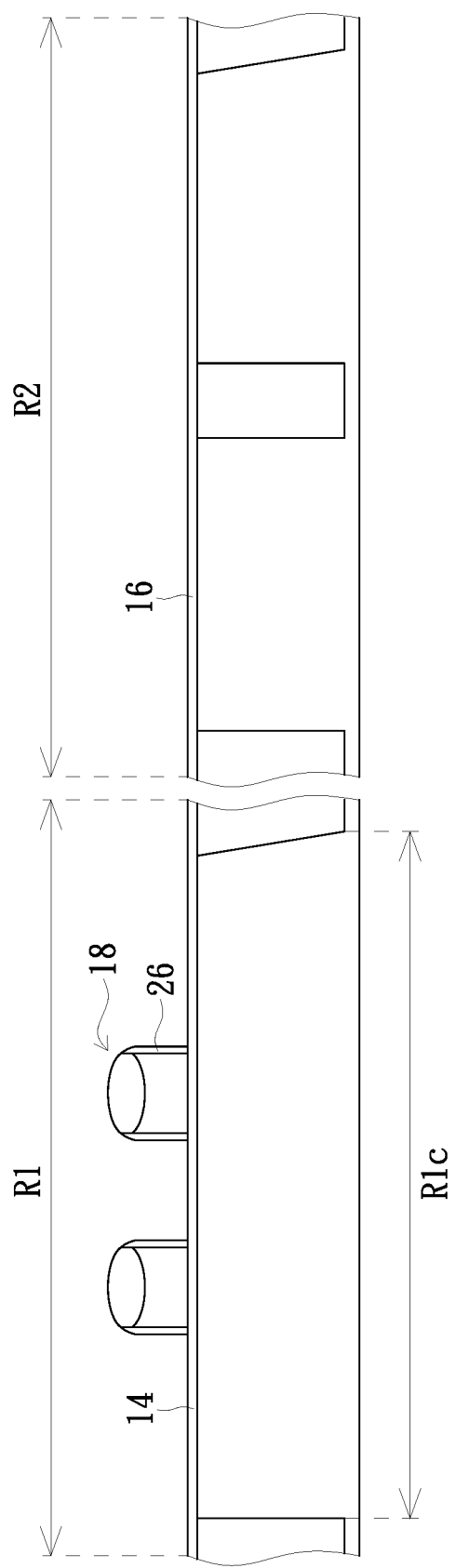

Then, as shown in FIG. 1E, an optional thermal oxidation process is performed to thermally grow silicon oxide as a buffer layer 26 on the two opposite sidewalls of each floating gate structure 18. In one embodiment, before the optional thermal oxidation process, a pre-cleaning process is carried out.

Figure 1F:
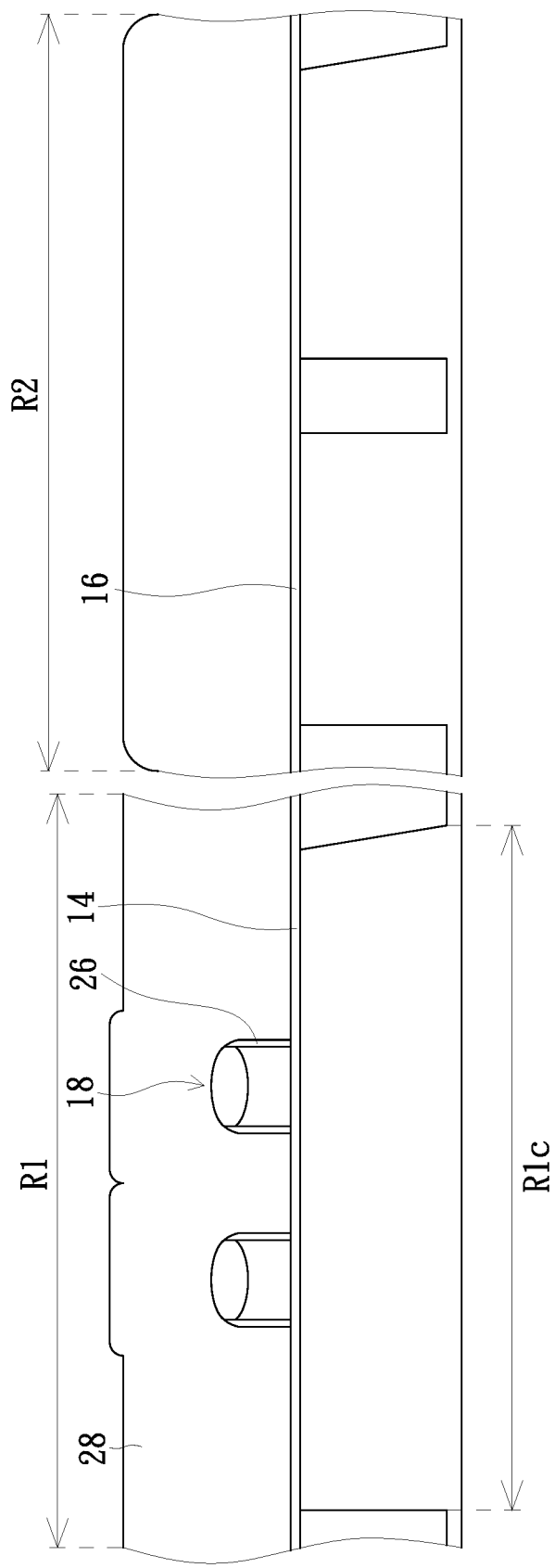

Next, as shown in FIG. 1F, an insulating layer 28 is disposed to cover the gate dielectric layers 14, 16 and the floating gate structures 18 with the buffer layer 26. In one embodiment, the material of the insulating layer 28 is silicon nitride, and the thickness of the insulating layer 28 is between 1500 Å (angstroms) and 3000 Å. Optionally, the insulating layer 28 is deposited by an LPCVD process.

Figure 1G:
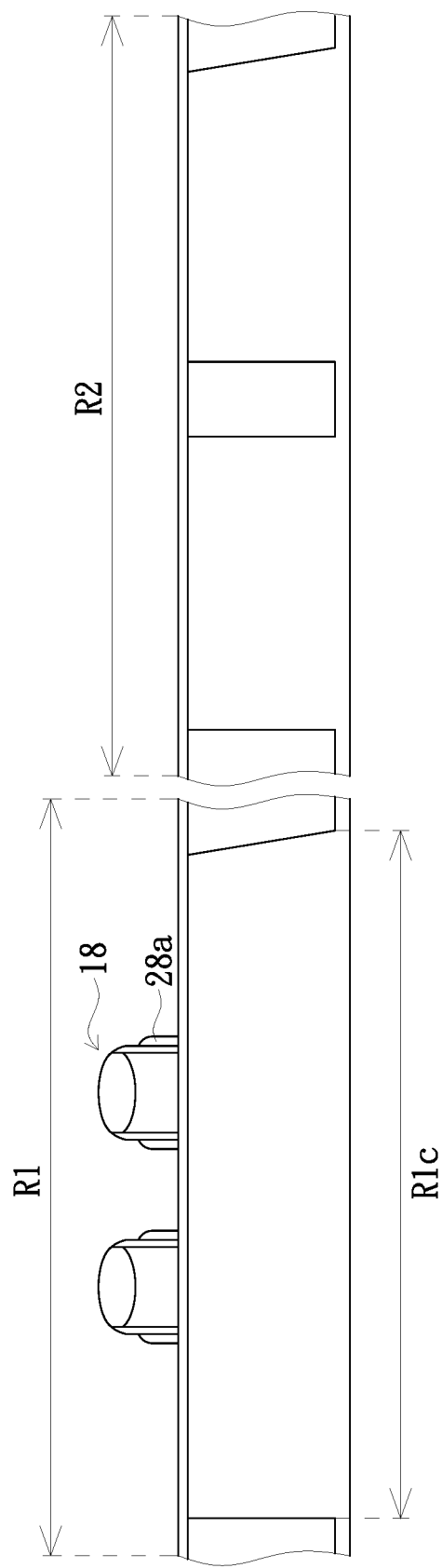

Then, as shown in FIG. 1G, the insulating layer 28 is etched back, and a part of the insulating layer 28 is kept as protective spacers 28a on two opposite sidewalls of each floating gate structure 18. In one embodiment, the protective spacers 28a are formed by anisotropically removing a part of the insulating layer 28 in a reactive ion etch (RIE) process.

Figure 1H:
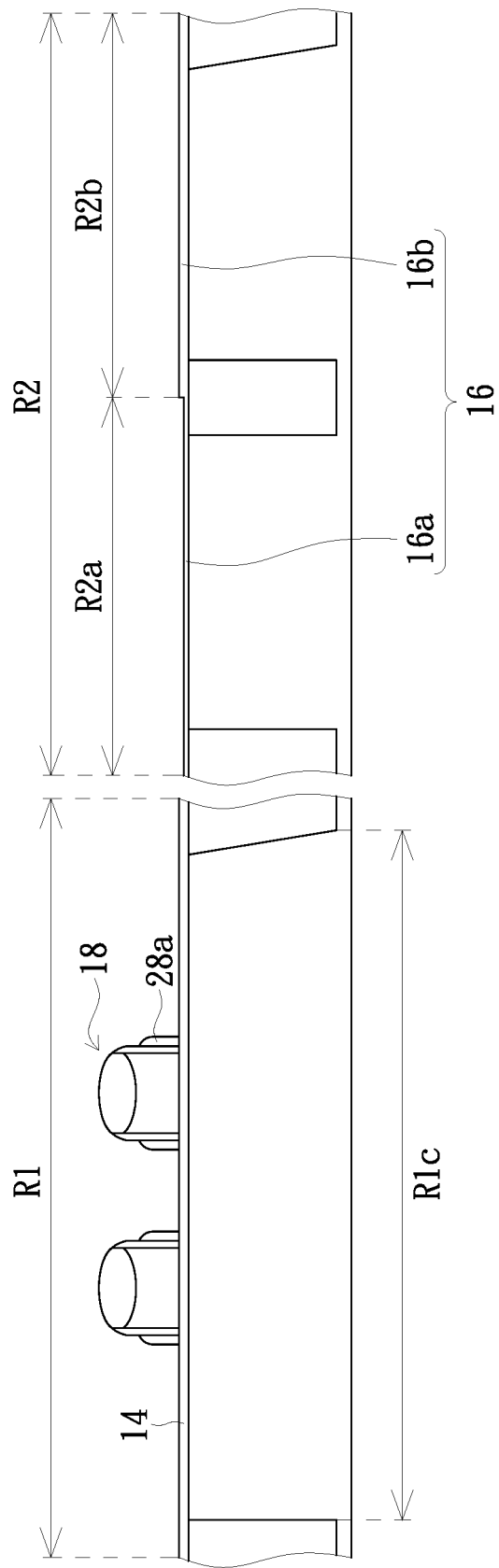

Optionally, the logic device region R2 may include a first logic circuit region R2a and a second logic circuit region R2b for respectively setting a low-voltage component and a high-voltage component. As shown in FIG. 1H, an oxidation process is performed on the gate dielectric layer 16 disposed on the logic device region R2 to make the thickness of the gate dielectric layer 16 on the first logic circuit region R2a and on the second logic circuit R2b be different. For example, a first gate oxide layer 16a and a second gate oxide layer 16b are formed on the first logic circuit region R2a and the second logic circuit region R2b, respectively, wherein the thickness of the first gate oxide layer 16a is thinner than that of the second gate oxide layer 16b. In general, a thinner first gate oxide layer 16a is formed on the first logic circuit region R2a for arranging low-voltage components, and a thicker second gate oxide layer 16b is formed on the second logic circuit region R2b for arranging high-voltage components.

Figure 1I:
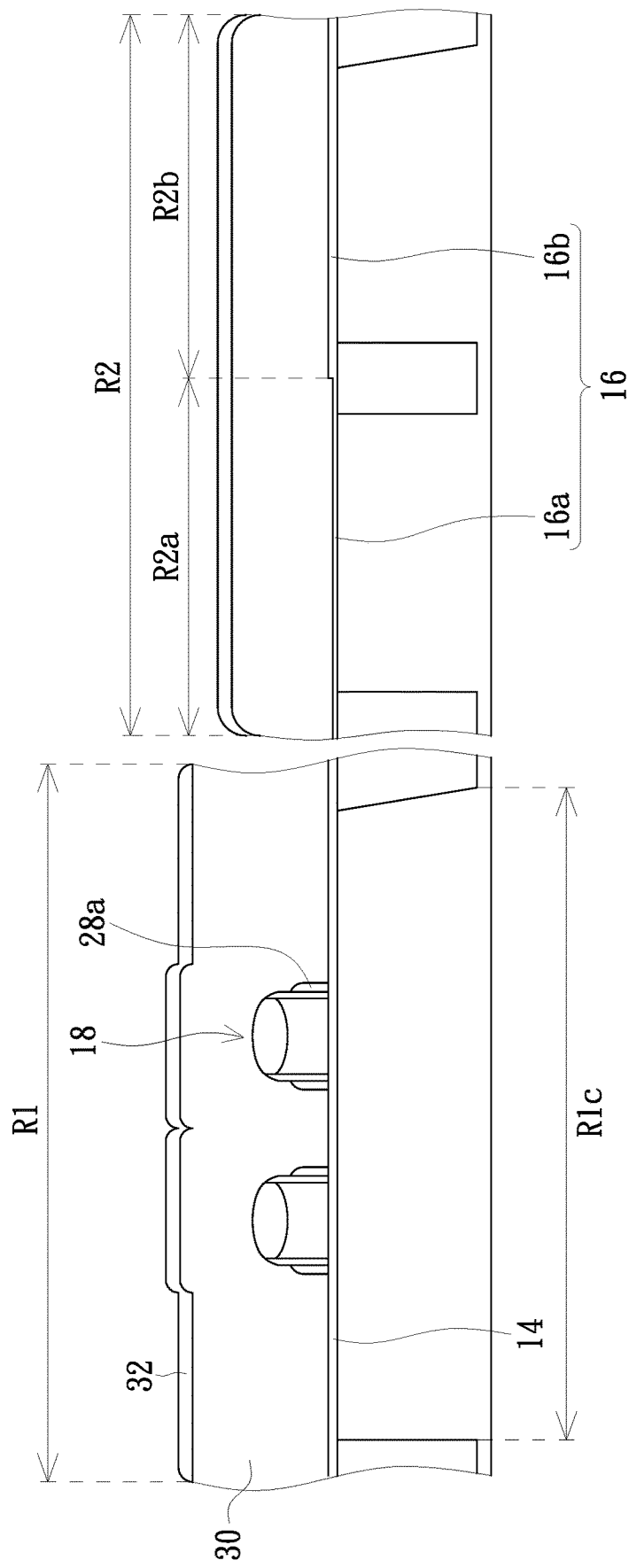

Then, as shown in FIG. 1I, a polysilicon layer 30 and a hard mask layer 32 are formed in sequence to cover the gate dielectric layers 14, 16, the floating gate structures 18 and the protective spacer 28a, wherein the hard mask layer 32 covers the polysilicon layer 30. In one embodiment, the thickness of the polysilicon layer 30 in the memory device region R1 may be thicker than the thickness of the polysilicon layer 30 in the logic device region R2. In one embodiment, the polysilicon layer 30 is an undoped polysilicon layer. The thickness of the polysilicon layer 30 is between 1000 Å and 2000 Å, and an example thickness is 1650 Å. The hard mask layer 32 is made of silicon nitride, silicon oxynitride or silicon dioxide. The thickness of the hard mask layer 32 is between 100 Å and 500 Å, and an example thickness thereof is 320 Å.

Figure 1J:
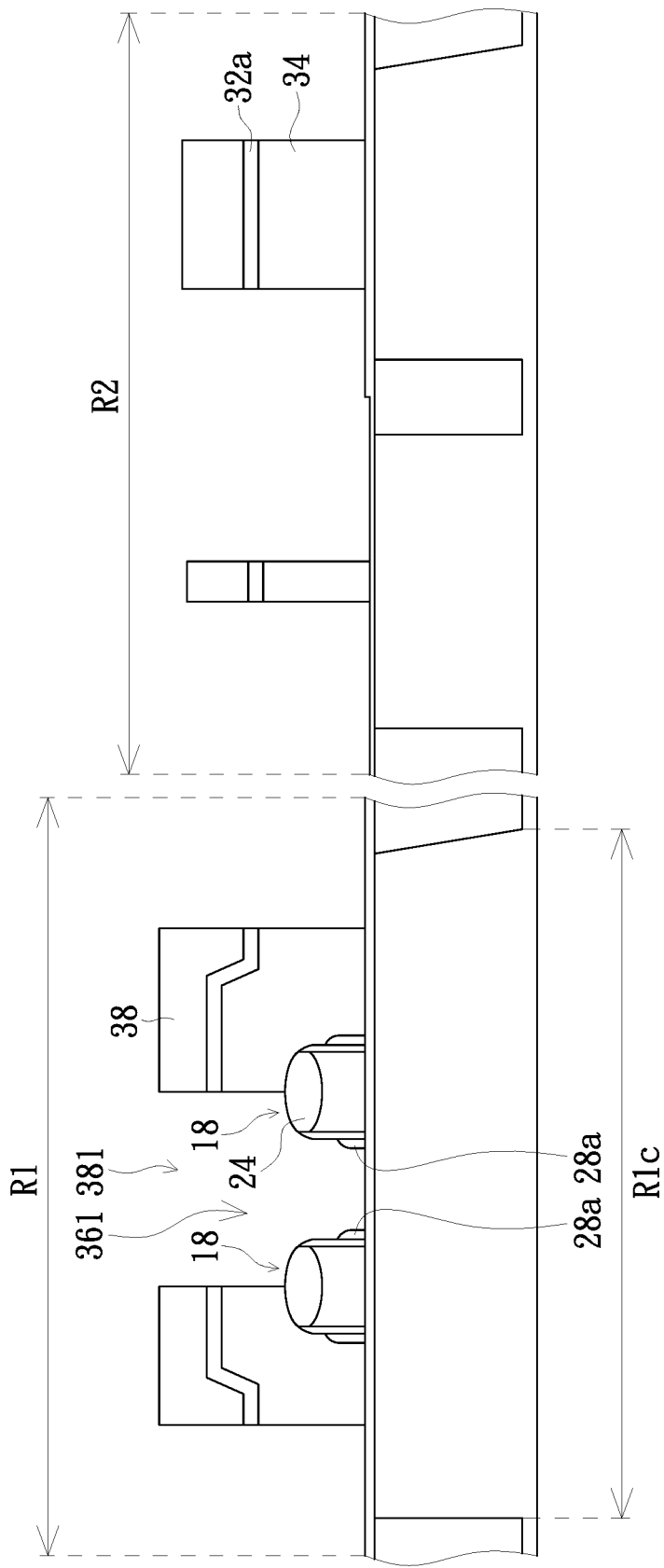

Next, microlithographic and etching processes are carried out next to patterning the polysilicon layer 30 and a hard mask layer 32, thereby forming polysilicon gate structures 34 covered by a hard mask layer 32a on the logic device region R2, and forming a polysilicon control gate structure 36 covered by a hard mask layer 32b on each cell area R1c. In other words, as shown in FIG. 1J, a patterned photoresist layer 38 with an opening 381 are first formed on the hard mask layer 32, and then using the patterned photoresist layer 38 as an etching mask, portions of the hard mask layer 32 and the polysilicon layer 30 are etched, so as to form polysilicon gate structures 34 covered by the hard mask layer 32a on the logic device region R2, and to form the polysilicon control gate structure 36 covered by the hard mask layer 32b on each cell area R1c to cover two adjacent floating gate structures 18 on each cell area R1c. The polysilicon control gate structure 36 has an opening 361 to expose the two protective spacers 28a facing each other between two adjacent floating gate structures 18. Optionally, a part of a surface of the polysilicon oxide layer 24 is also exposed by the opening 361.

Figure 1K:
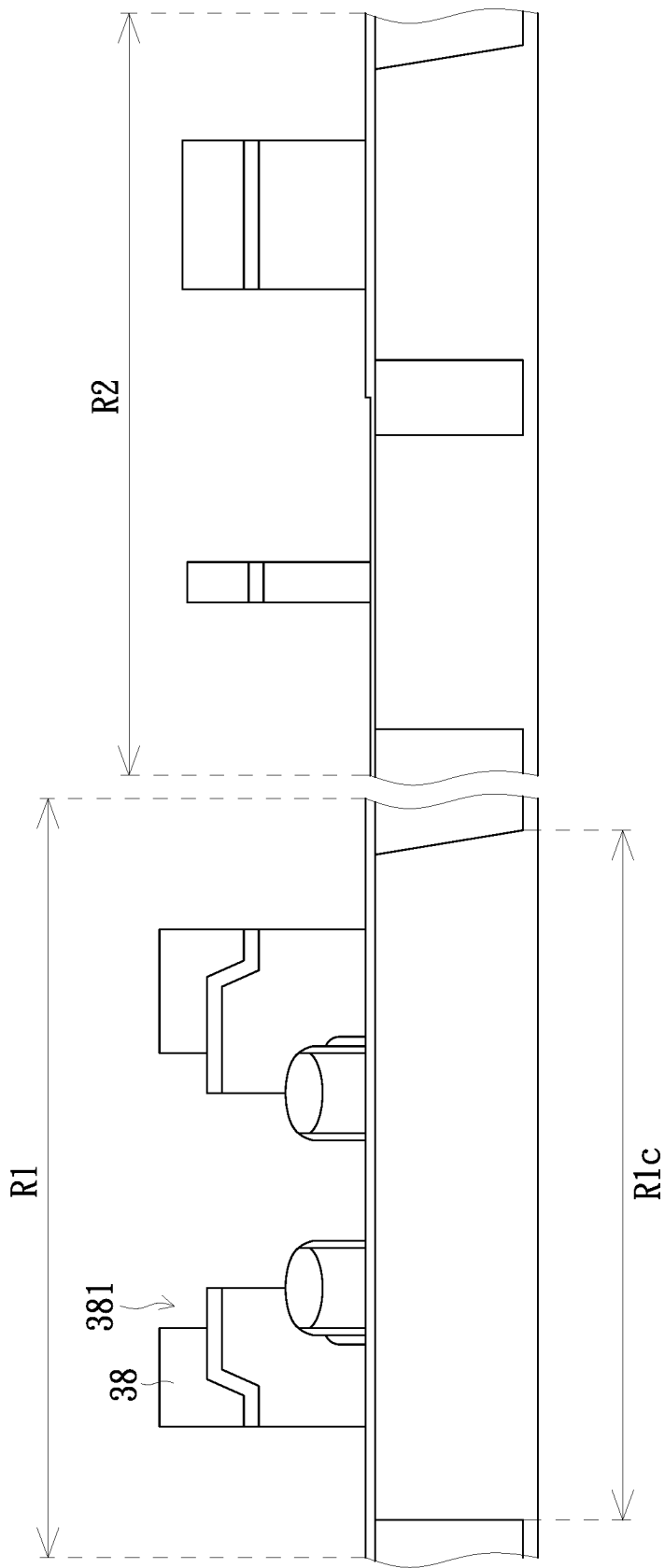

Then, as shown in FIG. 1K, the exposed protective spacer 18 (shown in FIG. 1J) is removed. In one embodiment, the exposed protective spacer 18 is removed with a phosphoric acid solution. In one embodiment, a portion of the patterned photoresist layer 38 is also removed by using the phosphoric acid solution, for example, and thereby the opening 381 of the patterned photoresist 38 is widened.

Figure 1L:
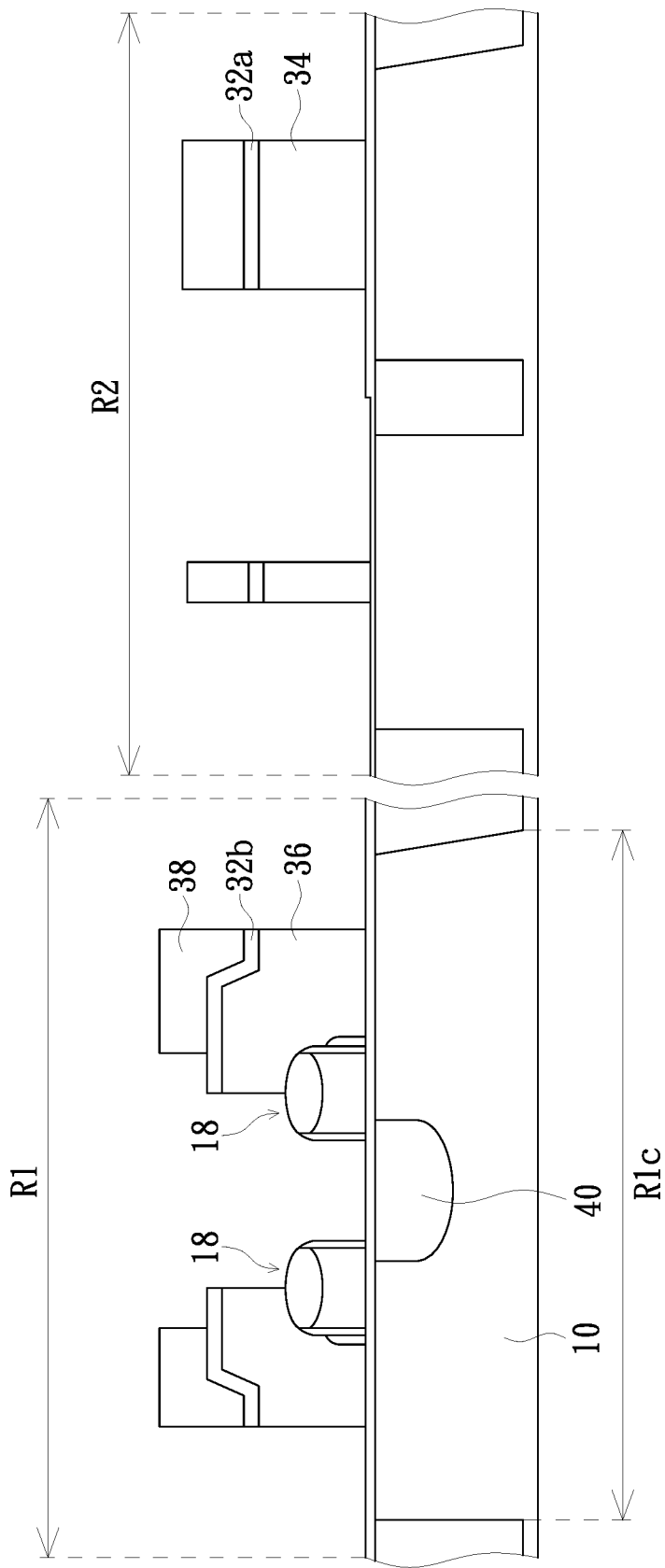
Figure 1M:
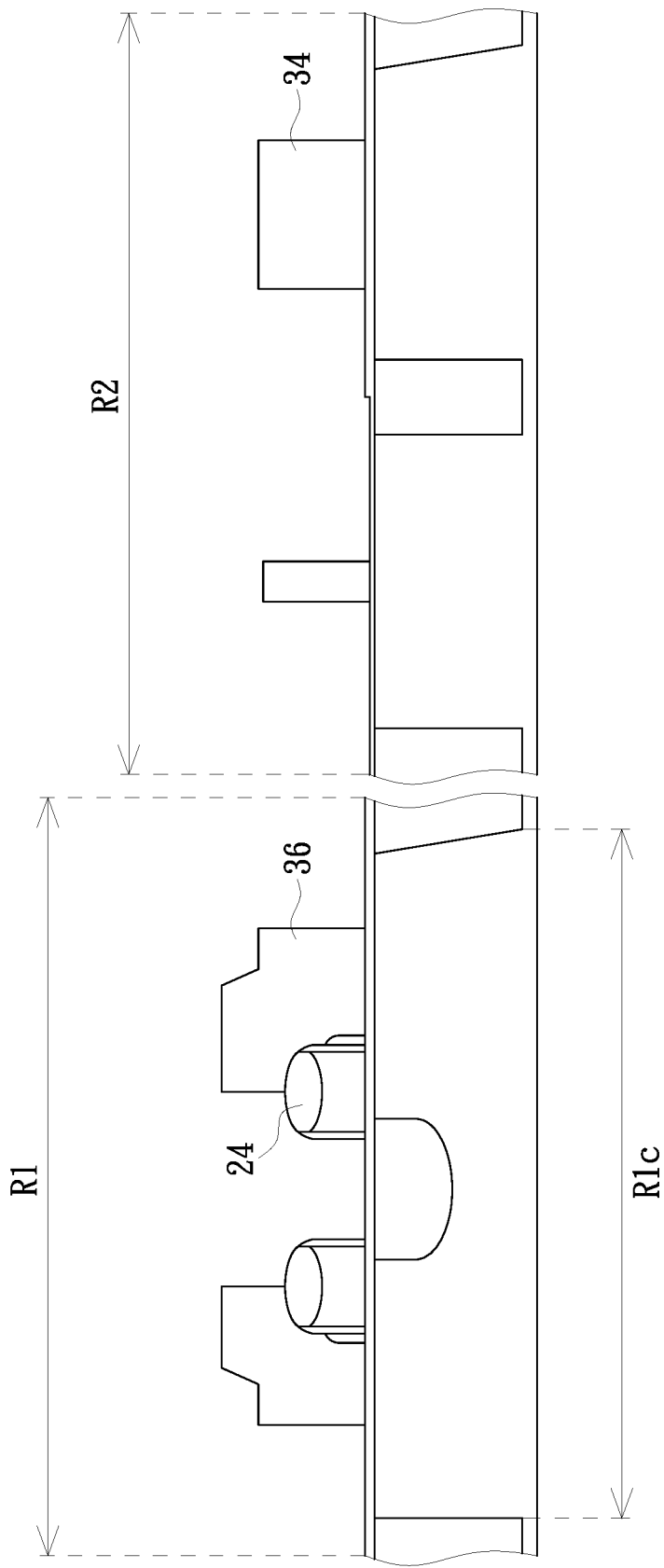

Then, as shown in FIG. 1L, an ion implantation is performed on the substrate 10 to form a source region 40 between the two adjacent floating gate structures 18 on each cell area R1c. Next, as shown in FIG. 1M, the patterned photoresist layer 38 and the hard mask layers 32a, 32b on the polysilicon gate structure 34 and the polysilicon control gate structure 36 are removed. Optionally, in one embodiment, after the step of removing the hard mask layers 32a, 32b, an annealing process is further performed to form an activation layer (not shown) on the part of the surface of the polysilicon oxide layer 24 not covered by the polysilicon control gate structure 36. In one embodiment, the annealing temperature may be between 1000° C. and 1200° C., and the example temperature thereof is 1050° C. A thickness of the active layer is between 1 Å and 50 Å, and the example thickness thereof is 27 Å.

In the present invention, the protective spacer is formed on the opposite sidewalls of each floating gate structure, so as to prevent polysilicon residues from being gathered in the corners of opposite sides of the floating gate structure when the polysilicon control gate structures and the polysilicon gate structure are subsequently formed in the memory device region and the logic device region, respectively. Afterwards, the protective spacer exposed through the opening of the polysilicon control gate structure is removed with a phosphoric acid solution. The method of the present invention can achieve the effect of fabricating the polysilicon control gate structure in the memory device region and the polysilicon gate structure in the logic device region by the same fabricating process, and there will be no polysilicon material residue in the memory device region or pitting/undercutting phenomenon in the logic device region, which both may result from the difference in the thickness of the polysilicon layer in the memory device region and the logic device region.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating flash memory, comprising:
providing a substrate defining a memory device region and a logic device region, wherein the memory device region comprises a plurality of cell areas;
forming a gate dielectric layer on the memory device region and the logic device region of the substrate;
forming a plurality of floating gate structures on the gate dielectric layer disposed on the memory device region, wherein each of the cell areas is formed with two floating gate structures, and each of the floating gate structures comprises a floating gate layer and a polysilicon oxide layer on the floating gate layer;
depositing an insulating layer to cover the gate dielectric layer and the floating gate structures;
etching back the insulating layer, and keeping a part of the insulating layer as protective spacers on two opposite sidewalls of each floating gate structure;
forming a polysilicon layer to cover the gate dielectric layer, the floating gate structures and the protective spacer;
forming a hard mask layer to cover the polysilicon layer;
removing a part of the hard mask layer and a part of the polysilicon layer to form at least one polysilicon gate structure on the logic device region, and to form a polysilicon control gate structure on each cell area to cover two adjacent floating gate structures on each cell area, wherein the polysilicon control gate structure comprises an opening to at least expose the two protective spacers facing each other between two adjacent floating gate structures;
removing the exposed protective spacer; and
performing an ion implantation on the substrate to form a source region between the two adjacent floating gate structures on each cell area.

2. The method for fabricating flash memory according to claim 1, wherein the steps of forming the floating gate structure comprise:
sequentially forming a doped polysilicon layer and a silicon nitride layer on the gate dielectric layer;
patterning the silicon nitride layer to form a plurality of patterned openings in the silicon nitride layer to pre-define the forming regions of the floating gate structures in the doped polysilicon layer;
performing a thermal oxidation process, wherein a portion of the doped polysilicon layer exposed by the patterned openings is oxidized to form the polysilicon oxide layers;
selectively removing the silicon nitride layer; and
etching the doped polysilicon layer by using the polysilicon oxide layer as an etching mask to form the floating gate layers.

3. The method for fabricating flash memory according to claim 1, wherein before the step of depositing the insulating layer, a thermal oxidation process is performed to form a buffer layer on the two opposite sidewalls of each floating gate structure.

4. The method for fabricating flash memory according to claim 1, wherein the material of the insulating layer is silicon nitride, and the thickness of the insulating layer is between 1500 angstroms and 3000 angstroms.

5. The method for fabricating flash memory according to claim 1, wherein the logic device region comprises a first logic circuit region and a second logic circuit region for respectively setting a low-voltage component and a high-voltage component.

6. The method for fabricating flash memory according to claim 5, wherein before the step of forming the polysilicon layer, an oxidation process is at least performed on the gate dielectric layer disposed on the logic device region to make the thickness of the gate dielectric layer on the first logic circuit region and the thickness of the gate dielectric layer on the second logic circuit be different.

7. The method for fabricating flash memory according to claim 1, wherein the polysilicon layer is an undoped polysilicon layer, and the thickness of the polysilicon layer is between 1000 angstroms and 2000 angstroms.

8. The method for fabricating flash memory according to claim 1, wherein the hard mask layer is made of silicon nitride, silicon oxynitride or silicon dioxide, and the thickness of the hard mask layer is between 100 angstroms and 500 angstroms.

9. The method for fabricating flash memory according to claim 1, wherein the step of removing a part of the hard mask layer and a part of the polysilicon layer further comprises: first forming a patterned photoresist layer on the hard mask layer, and then using the patterned photoresist layer as a mask to etch the hard mask layer and the polysilicon layer.

10. The method for fabricating flash memory according to claim 1, wherein the exposed protective spacer is removed with a phosphoric acid solution.

11. The method for fabricating flash memory according to claim 1, wherein after the ion implantation step is performed, the hard mask layer on the polysilicon gate structure and the polysilicon control gate structure is removed.

12. The method for fabricating flash memory according to claim 11, wherein after the step of removing the hard mask layer, an annealing process is further performed to form an activation layer on a part of a surface of the polysilicon oxide layer not covered by the polysilicon control gate structure.

13. The method for fabricating flash memory according to claim 12, wherein a thickness of the active layer is between 1 angstrom and 50 angstroms.

\* \* \* \* \*